United States Patent [19]
Cahill et al.

[11] 3,796,882
[45] Mar. 12, 1974

[54] SILICON-CADMIUM SELENIDE HETEROJUNCTIONS

[75] Inventors: John G. Cahill, Brewster, N.Y.; Bhim S. Sharma, San Jose, Calif.; Yde J. Van der Meulen, Yorktown Heights, N.Y.

[73] Assignee: International Business Machines, Armonk, N.Y.

[22] Filed: May 8, 1972

[21] Appl. No.: 251,205

[52] U.S. Cl. .......................... 250/211 J, 317/235 N
[51] Int. Cl. .......................... H01j 39/12
[58] Field of Search ............ 250/211 R, 211 J, 213; 317/235 N

[56] References Cited

UNITED STATES PATENTS

| | | | |
|---|---|---|---|
| 3,520,732 | 7/1970 | Nakayama | 317/235 N |
| 3,578,507 | 5/1971 | Chiang | 317/235 AC |
| 3,478,214 | 11/1969 | Dillman | 317/235 AC |
| 3,436,549 | 4/1969 | Pruett | 317/235 N |

OTHER PUBLICATIONS

"Electrical Properties of Semiconductor Photodiodes with Semitransparent Film" Jap. Jour. of Appl. Phys Vol. 10 No. 11 by Kondo et al.

*Primary Examiner*—James W. Lawrence
*Assistant Examiner*—D. C. Nelms
*Attorney, Agent, or Firm*—George Baron

[57] ABSTRACT

It is desirable to provide photodiodes that can be manufactured at low temperatures ( $\leq 250°C$), have large light-sensitive areas ( $\geq 1cm^2$), produce a photocurrent that is linearly responsive to photon flux, have low dark sensitivity and high light sensitivity, a low optimum operating voltage of ~ 1.5 volts and relatively fast rise and decay times of the order of 3 microseconds. A silicon-cadmium selenide p-n heterojunction has been found to have the above noted desirable characteristics.

4 Claims, 6 Drawing Figures

SILICON-CADMIUM SELENIDE HETEROJUNCTIONS

BACKGROUND OF THE INVENTION

Photodiodes, phototubes, and photoelectric cells have wide use in industrial and scientific applications as means for detecting or sensing low energy light of different wavelengths. The sensing surface in such detectors can be made most sensitive to narrow or large regions in the visible, infra-red or ultraviolet light. For many applications, it is desirable to employ a light detector that has the following combination of at least the following features, namely, a high ratio of light/dark current, maximum sensitivity at low operating voltages and a low dark current. Additionally, it would also be desirable to be able to manufacture such light detector so that its detector or sensitive surface is large, that is $1 cm^2$, and such light detector should tolerate a large backvoltage, of the order of 10 volts, without being destroyed.

In many known photosensitive devices now available, such as the silicon or germanium p-n photodiode , it is difficult or expensive to achieve large sensitive areas, particularly wherein diffusion of dopants in a semiconductor is used to attain the required p-n junction. Moreover, most known photodiodes and the like cannot tolerate even slight ($<<5$ volts) backvoltage without being destroyed. The photosensitive device that is the subject of the present invention is a p-n heterojunction of n-type CdSe on p-type silicon. Such a heterojunction has produced the desirable characteristics sought in the manufacture of a light detector. Moreover, the novel manner in which such silicon-cadmium-selenide p-n heterojunction is manufactured, as will be described in detail hereinafter, produces a high resistance CdSe layer and thus allows for the construction of a light detector having the aforementioned characteristics.

It is an object of this invention to provide a novel photodetector comprising a silicon-cadmium selenide (p-n) heterojunction.

It is yet another object to provide such a silicon-cadmium selenide (p-n) heterojunction having a combination of desirable characteristics not heretofore attainable in available photodetectors.

It is a further object to provide a method of controlling certain steps in the manufacture of an n-type CdSe film on a p-type silicon substrate so that an improved photodetector can be achieved.

The foregoing and other objects, features, and advantages of the invention will be apparent from the following more particular description of the preferred embodiments of the invention as illustrated in the accompanying drawings.

DESCRIPTION OF THE DRAWINGS

FIG. 1 illustrates the equipment, most of which is conventional, for manufacturing the novel photodetector. A chamber 2 surrounded by walls 4 contains a substrate holder 6 of boron nitride. Inserted within recesses in said boron nitride are silicon substrates 8, the latter being etched with hydrofluoric acid, rinsed with deionized water and dried immediately before evacuating the chamber 2 so as to insure an oxide film of less than 10A. on said silicon. It has been found that when the silicon substrate 8 is not so treated prior to evacuation, oxides thicker than 25A. may easily form on said silicon substrate 8, and such an oxide layer prevents the proper operation of photodetectors made in accordance with the method described hereinafter.

Figure 1:
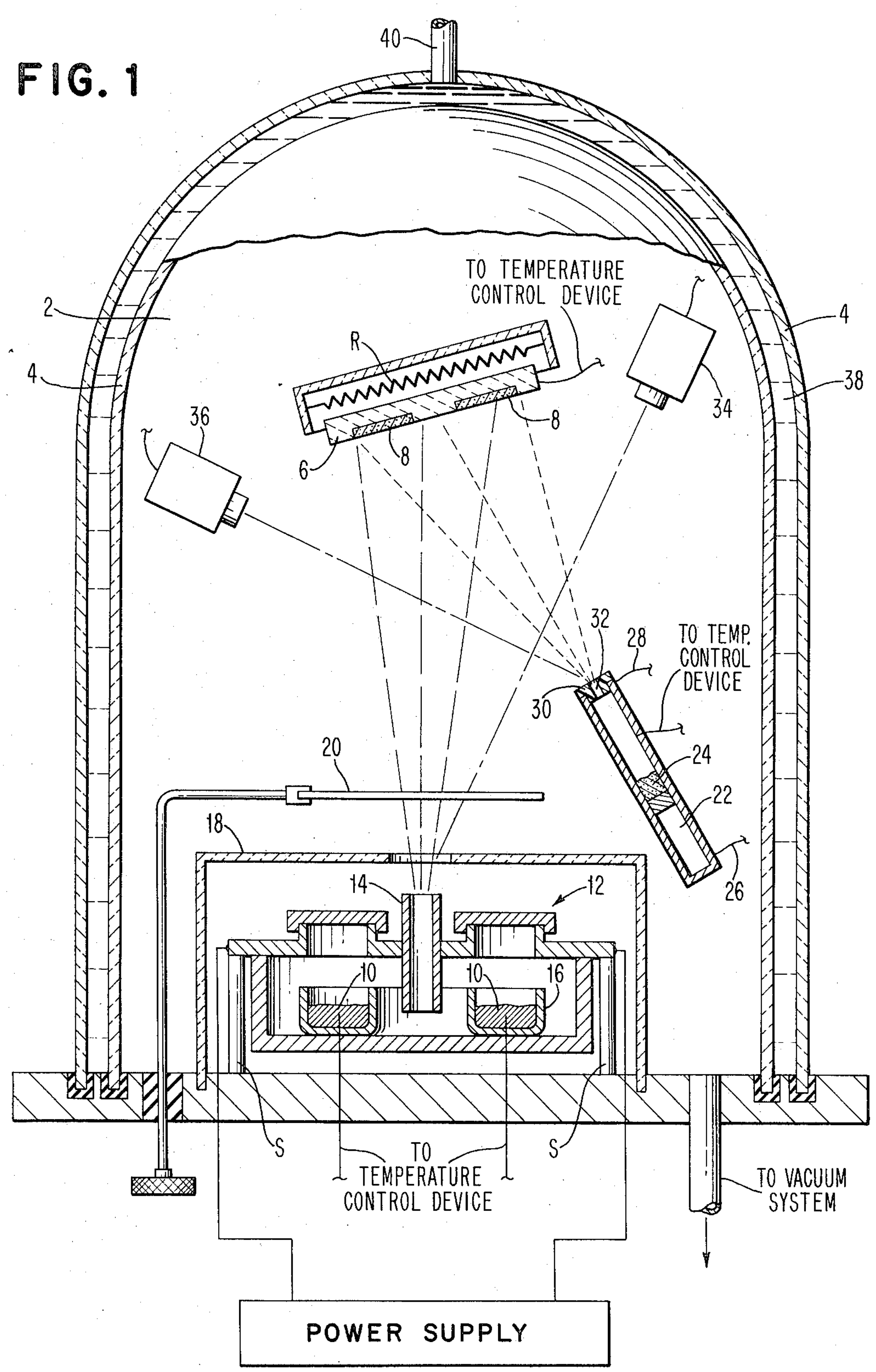
FIG. 1 is a schematic representation of the evacuated chamber and auxiliary equipment used in the manufacture of an n-type CdSe film on a p-type silicon wafer to form a novel photodetector.

The silicon substrate 8 has been grown to have a resistivity typically of the order of 2 ohm-cm and once it is affixed in its appropriate recess (one or more silicon substrates may be used during an evaporation process), chamber 2 is evacuated to a pressure of $10^{-7}$ to $10^{-8}$ mm of mercury and heating of the cadmium and selenium sources is begun. The cadmium container 10 is a two chambered boat 12 heated resistively and supported within chamber 2 on insulated supports S, the boat itself serving as a source of heat for vaporizing the cadmium 10. The boat 12 contains baffles 14 and 16 so as to be barriers for particles of cadmium that may be spewed out by the cadmium sources 10 during their resistive heating and permit mainly cadmium vapor to exit from the boat and impinge on target 6 and its silicon substrates 8. The heat shield 18 is water-cooled by means not shown. Shutter 20 is rotatable, at will or by a suitable timing mechanism, not shown, to regulate the evaporation of cadmium onto target 6. In a similar manner, a boat 22 contains a source of selenium 24 and conducting strips 26 and 28 carry current for providing the resistive heating to evaporate the selenium 24 toward target 6. Boat 22 is provided with a plug 30 having a central aperture 32 through which the selenium vapor exits from boat 22.

Associated with each evaporating source is a rate monitor 34 and 36 which are shown schematically in that each is a standard evaporation rate monitor and are of the kind made by the Allen-Jones Company of Gardena, Calif.

In an actual deposition of a heterojunction photodiode, the substrate 6, by means of heating resistor R, was heated to and was maintained at a temperature of approximately 250°C after the chamber was evacuated to about $2\text{–}4 \times 10^{-8}$ Torr. The cadmium and selenium sources were located so that an angle of $\sim 30°$ was made by the axes of each source. The substrate holder 6 and substrates 8 were positioned to make an equal angle with both sources, such angle having been found to aid in the proper crystallographic growth of the CdSe compound. Additionally, the selenium temperature is chosen so that it has a vapor flux that is 10–15 times the vapor flux of the cadmium at the substrate 8. This ratio of selenium to cadmium produces a highly resistive CdSe film, of the order of $10^7$ ohm-cm when measured perpendicularly to the plane of deposition, and one that is very close to being stoichiometric. The heating of the cadmium and selenium was at a rate such that an n-type CdSe film was grown to a thickness of $\sim$ 4,000A. after a 45 minute deposition. In order to insure that only Cd atoms and Se molecules emanating directly from containers 12 and 22, respectively, will impinge on substrate 8, shrouds 38 surrounded walls 4 and liquid nitrogen was poured into such shrouds 28 from port 40. The cooled walls cause scattered atoms of Cd or scattered molecules of Se to condense thereon so that only direct evaporation of these materials onto the substrate 6 could take place. The temperature of the substrate 6 (~250°C), the temperature of the Cd and Se sources, and the pressure of the chamber are such that the vapor pressure of each element, Cd and Se, will prevent permanent condensation of the individual elements alone on the substrate 6. However, the vapor pressure of the compound CdSe is sufficiently low to prevent its reevaporation.

Figure 2A:
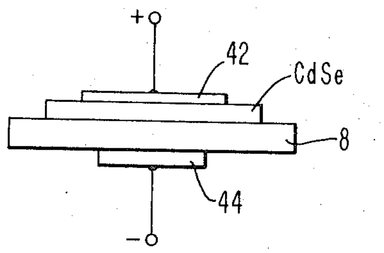
FIG. 2A is a novel photodetector and FIG. 2B is a circuit in which such novel photodetector is employed as a light detector.
Figure 2B:
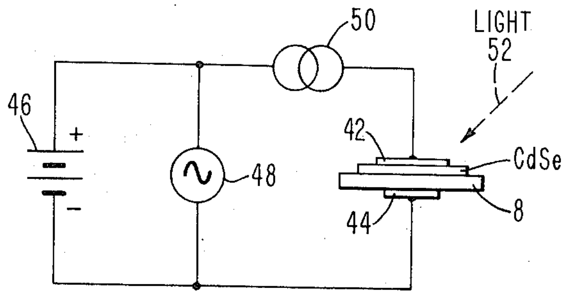
Figure 3:
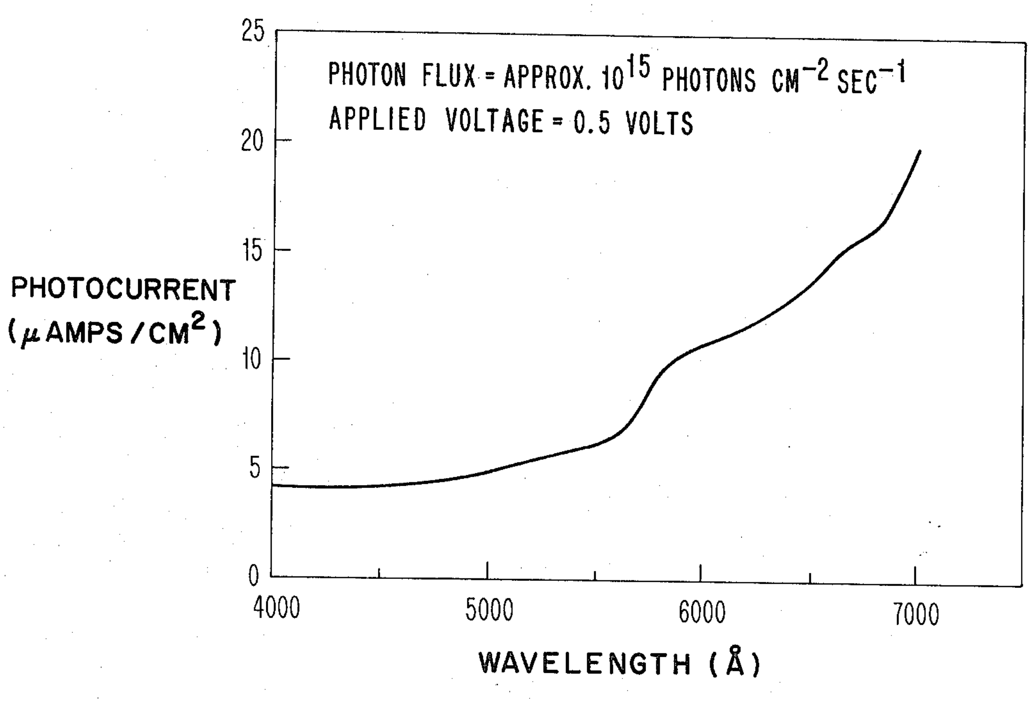
FIG. 3 is a plot of the photocurrent versus wavelength showing the sensitivity of the n-type CdSe on p-type silicon as a function of wavelength.

When the required thickness of CdSe has been deposited on the p-type silicon wafer 8, the latter is removed, and provided, as seen in FIG. 2A, with a transparent electrode 42, such as a 200–300A. thick film of gold or platinum on the CdSe surface, and an ohmic contact 44 was made to silicon wafer 8. Such electrode 44 need not be transparent and can be much thicker than electrode 42. The completed photodetector is placed in the circuit shown in FIG. 2B wherein a source of electrical energy, such as battery 46, voltmeter 48 and ammeter 50 are connected as shown so that the photodetector is forward biased by battery 46. When light energy 52 impinged upon the n-type CdSe layer which was deposited on the p-type silicon wafer 8, measurements were conducted with positive biases of between 0 to 50 volts being applied to electrode 42, for different wavelengths of light 52. FIG. 3 is a plot of current in microamps per $cm^2$ through the photodetector for different wavelengths of light and it is seen that the CdSe photodetector increases in sensitivity towards longer wavelengths in the visible region. For a value of $\lambda$=6,328A, the ratio of dark resistivity $\rho_D$ to light resistivity $\rho_L$ equals $4X10^4$ for a photon flux of $\sim 1.5X10^{18}$ photons $sec.^{-1}$ $cm^{-2}$ and an applied voltage V = 0.5 volt at a dark resistivity $\rho_D \approx 0.7$ megohms when the junction involved has an area equal to 1 square centimeter.

Figure 4:
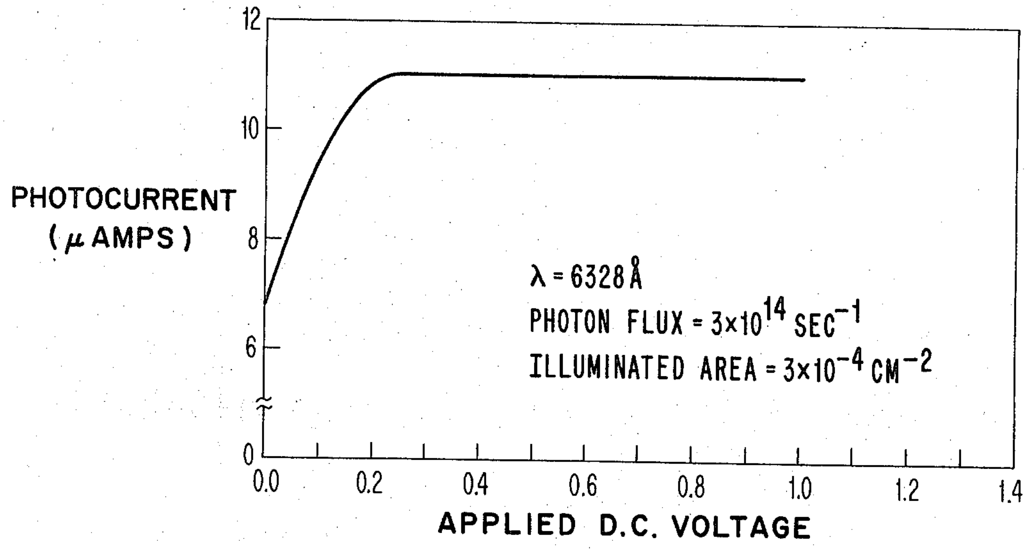
FIG. 4 is a plot of light-induced current as a function of operating voltage of the photodetector.

FIG. 4 is a plot of photocurrent in microamps induced in the n-type CdSe—p-type silicon heterojunction as a function of positive voltage applied to the transparent electrode 42 at the parameters indicated in the figure. It is seen that the light induced photocurrent saturates at very low voltages, i.e., about 0.2 to 0.3 volts giving rise to a low optimum operating voltage.

Figure 5:
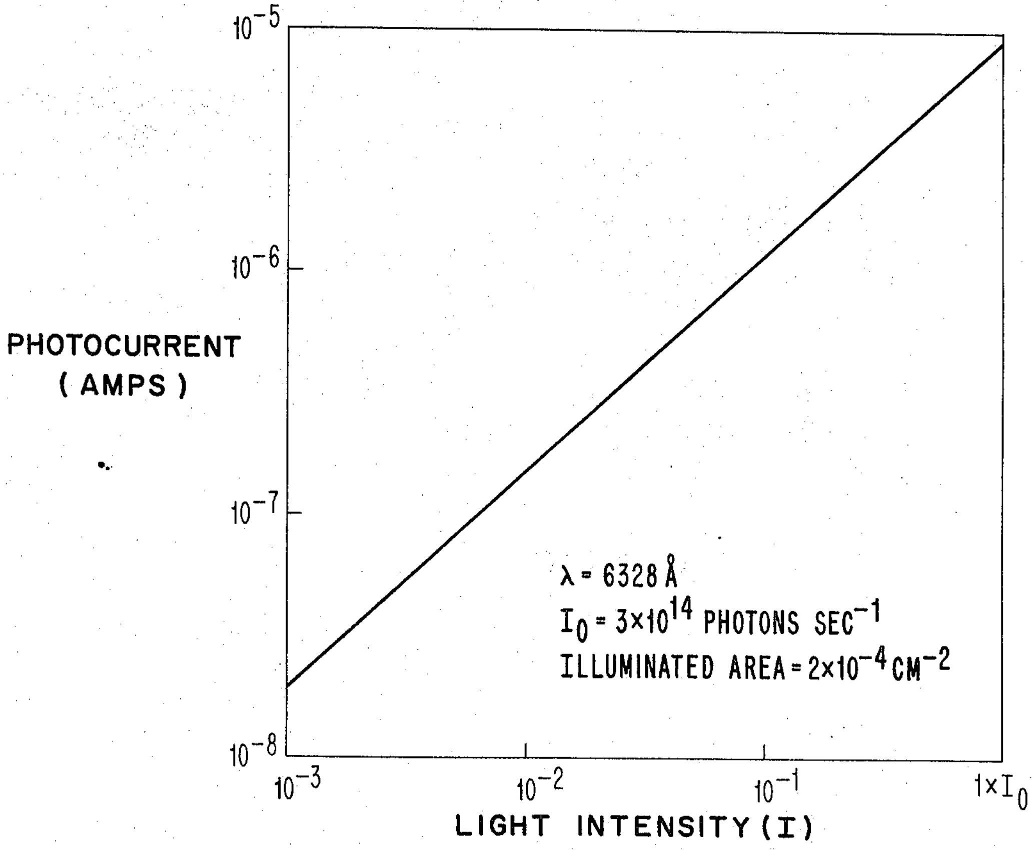
FIG. 5 is a plot of photocurrent as a function of light intensity.

FIG. 5 is a plot of light-induced photocurrent in amperes as a function of the intensity (in photons per sec.) of light impinging on a CdSe layer about 0.35 microns thick and the applied voltage is 0.5 volts. The FIG. 5 plot indicates an almost linear relationship between increase in intensity and increase in light-induced photocurrent.

When a negative voltage (or forward bias) was applied to the novel photodetector forming the basis of this invention, it was found that the photodetector could sustain forward biases as high as five volts without evidencing any impairment of its normal operation as a photodetector using a reverse bias. Most known photodetectors would be irreparably damaged if they were to suffer such a forward bias voltage. It is believed that this ability to resist such forward biases up to at least 5 volts is due to the high series resistance presented by the CdSe film. For forward biases of 5 volts or less, there is a dark current that is about 12 milliamperes per $cm^2$, but the device does not suffer any thermal breakdown.

Not only has a novel photodetector been devised, but by novel control of the ratio of the rate of deposit of selenium atoms to cadmium atoms, and the cooling of the walls of the evaporation chamber to avoid spurious deposition, a photodetector has been created which can be fabricated at temperatures as low as 250°C and have light-sensitive areas 1 $cm^2$. Moreover, the photodetector has a fast rise and decay time of 3 microseconds as well as high dark resistivity and high light sensitivity. It also has a linear response of photocurrent to photon flux and has low optimum operating voltage, i.e., <1.5 volts. Last, but not least, the novel photodetector can tolerate forward biases up to 5 volts without any apparent breakdown.

What is claimed is:

1. A composite unit for use as a hetero-junction photodiode comprising a p-type silicon substrate, and a cadmium selenide film of the order of 3,000–6,000A. thick on said silicon substrate and having a resistivity of the order of $10^7\Omega$-cm.

2. The composite unit of claim 1 including contacts on said silicon substrate and said cadmium selenide film, respectively, wherein the contact on said cadmium selenide film is transparent.

3. A composite unit for use as a heterojunction photodiode comprising a p-type silicon substrate, an n-type cadmium selenide film of the order of 3,000–6,000A thick on said substrate having a resistivity of the order of $10^7\Omega$-cm, an ohmic contact on said silicon substrate, a transparent contact on said cadmium selenide film, and a source of electrical potential connected across said unit to said contacts.

4. The composite unit of claim 3 including an ammeter in series with said source of potential to record changes in current flow through said unit when light impinges on said cadmium selenide.

* * * * *